Oct. 21, 1958 J. I. PANKOVE 2,857,527

SEMICONDUCTOR DEVICES INCLUDING BIASED P+P OR N+N RECTIFYING BARRIERS

Filed April 28, 1955

INVENTOR.
JACQUES I. PANKOVE
BY J. L. Whittaker
ATTORNEY 2,857,527

SEMICONDUCTOR DEVICES INCLUDING BIASED P+P OR N+N RECTIFYING BARRIERS

Jacques I. Pankove, Princeton, N. J., assignor to Radio Corporation of America, a corporation of Delaware Application April 28, 1955, Serial No. 504,501

7 Claims. (Cl. 307—88.5)

Figure 1:
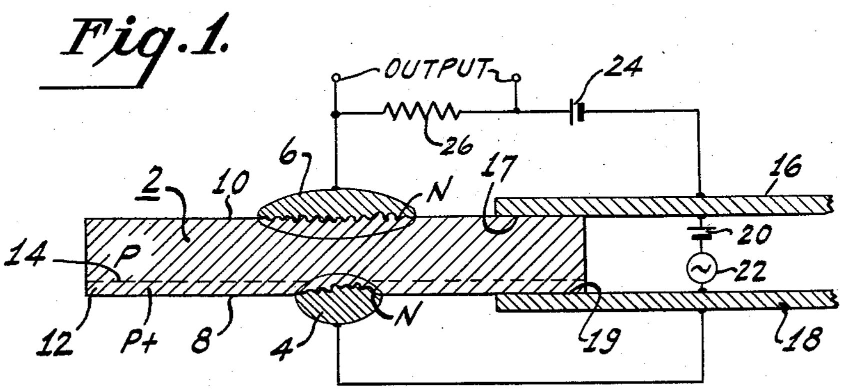

This invention relates to improved semiconductor devices and methods of operating them. More particularly it relates to such devices having improved electrical characteristics and relatively low minority carrier surface recombination velocities.

Semiconductor devices such as transistors usually include bases of crystalline semiconductive material of one conductivity type, either n or p, having an excess of one type of electric current carriers, electrons or holes, with respect to current carriers of the opposite type. The excess carriers are called "majority" carriers and the opposite type carriers are called "minority" carriers. The operation of many semiconductor devices depends upon minority carriers being injected into a semiconductor body at one point and being collected at another point after traversing a substantial portion of the bulk of the body.

The efficiency of many such devices depends in large part upon the proportion of the injected minority carriers that is collected, since uncollected carriers represent a lost fraction of a signal input. The minority and majority carriers being of opposite electrical sign are mutually attractive, and when a minority carrier combines with a majority carrier it is lost. A relatively large proportion of this loss occurs at the surface of the semiconductor body and is called "surface recombination." The loss occurring within the body, bulk recombination, is generally of somewhat less importance than surface recombination and may be minimized by known techniques of preparing the semiconductive material.

The surface recombination effect in a body is measured by a coefficient known as the "surface recombination velocity" which may be defined as the average velocity with which injected minority carriers approach the surface of the body. This average velocity is determined by diffusion limitations and is increased by surface recombination which brings about a relatively low minority carrier concentration at the surface and thus induces an increased concentration gradient adjacent to and in the direction of the surface. An increase in the concentration gradient increases the diffusion velocity in the direction of the gradient.

One object of the instant invention is to provide an improved method of minimizing surface recombination velocity in a semiconductor device.

Another object is to provide improved semiconductor devices having reduced surface recombination velocities.

These and other objects of the instant invention are accomplished by providing a surface region in a semiconductor body of relatively high conductivity but of the same conductivity type as the bulk of the body. This surface region is electrically separated from the bulk of the body by a p+-p or an n+-n rectifying barrier and is maintained at a different electrical potential from the bulk of the body during operation of the device. The difference in potential between the surface region and the bulk of the body is effective to repel minority charge carriers from the surface, thus minimizing the surface recombination velocity.

Figure 2:
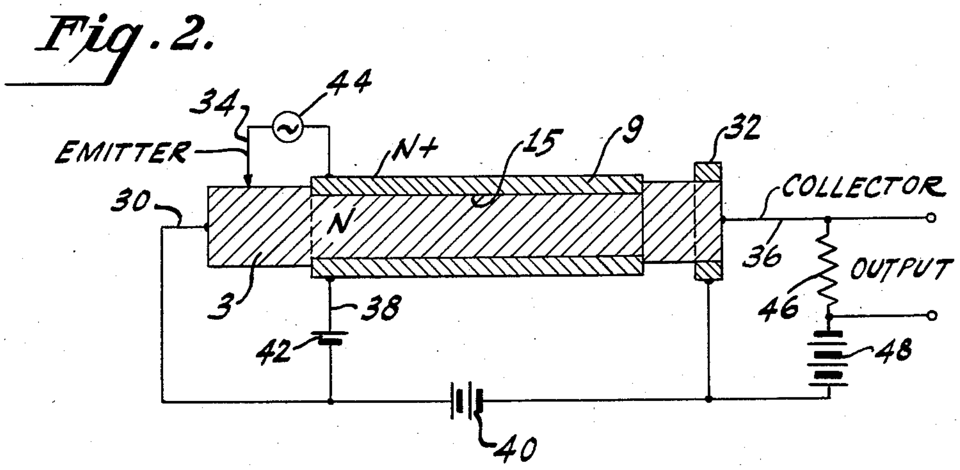

The invention will be described in greater detail in connection wtih the accompanying drawing of which:

Figures 1 and 2 are schematic, cross-sectional, elevational views of two different devices according to the invention.

Similar reference characters are applied to similar elements throughout the drawing.

It may be explained at this point that a p+-p or an n+-n barrier differs markedly from a p-n type barrier and generally exhibits a much lower rectification ratio. Whereas current flow across a reverse-biased p-n barrier is restricted primarily to minority charge carriers, the flow across a similary biased p+-p or n+-n barrier consists principally of majority carriers, the minority carriers being repelled from the barrier into the region of lower conductivity. In each case, of course, the term "reverse bias" refers to an electric potential applied across the barrier in the direction of maximum resistance to current flow.

Further to illustrate the differences between the two types of barriers, a p-type electrode upon an n-type base may be compared with an n+ electrode upon the same base. A p-n junction barrier is generally formed between the p-type electrode and the base. A reverse direction bias in this case is one that makes the p-type electrode negative with respect to the base. The electrode, thus, attracts minority (positive) charge carriers from the base and acts as a sink to drain them from the base. In the case of the n+ electrode, however, a reverse bias is of the opposite polarity and must be in a direction to make the electrode positive with respect to the base. This electrode, thus, repels the minority charge carriers in the base and does not collect them as does the p-type electrode.

A reverse bias on the p-type electrode is in a direction to drive electrons from the electrode into the base and to attract holes from the base toward the electrode. Since electrons are minority carriers in the electrode and holes are minority carriers in the base the current across the barrier is limited to minority carrier conduction and is of a relatively low value. In the case of the n+ electrode the situation is different. Reverse current across the n+-n barrier may consist principally of electrons moving from the base into the electrode, and since electrons are the majority carriers of the base the current may be relatively large. The minority carriers (holes) exist in the n+ region in insufficient number to constitute a significant portion of the reverse current.

Although the p+-p and n+-n barriers utilized according to the invention are inferior rectifying barriers relative to p-n barriers, they are capable of effects not possible with p-n barriers. This comes about primarily because of the polarity reversal required to produce corresponding bias conditions upon the two types of barriers.

Referring now to the drawing, Figure 1 shows an n-p-n triode transistor device according to the instant invention. This device comprises, for example, an emitter electrode 4 and a collector electrode 6 surface alloyed in coaxial alignment upon opposite faces 8 and 10, respectively, of a base wafer 2 of p-type semiconductive germanium having a resistivity of about 1 to 5 ohm-cm. The wafer may be of conventional size such as about 0.1" x 0.125" x .005" thick. It includes a surface region 12 of p-type low resistivity material, of about .001 to .02 ohm-cm., electrically separated from the bulk of the wafer by a p+-p rectifying barrier indicated by the broken line 14. A base tab 16 is connected by a non-rectifying solder contact 17 to the bulk of the base. A second tab 18 is connected by a non-rectifying contact 19 to the high conductivity surface region 12. Thus the device includes a base wafer having an emitter electrode and a collector electrode each in contact with the bulk of the wafer. A surface region of higher conductivity than the bulk of the wafer surrounds the emitter electrode and is electrically separated from both the electrode and the bulk by rectifying barriers. The barrier between the surface region and the electrode is a p-n rectifying junction, while that between the surface region and the bulk of the wafer is of the p+-p type.

The device may be incorporated in a circuit such as that shown in the drawing. The emitter electrode may be connected directly to the surface region tab 18 and biased with respect to the base wafer by a D. C. potential of preferably about 0.1 to 1 volt, such as may be supplied by a battery 20. The input signal to be amplified is derived from a signal source 22 and is applied between the base tab 16 and the emitter 4. It is immaterial, of course, in so far as the operation of the instant device is concerned whether the input signal 22 is applied between the base tab 16 and the battery 20 or as shown between the battery 20 and the surface region tab 18. Alternatively, the input signal may be applied between the surface region tab 18 and the emitter 4, although this may result in signal deterioration due to rectification at the barrier between the electrode and the surface region.

The collector electrode 6 is biased as by a battery 24 in series with an output load resistor 26. The bias voltage, which may be about 3 to 30 volts, drives the collector positive with respect to the bulk of the base wafer. The output load resistor may be chosen according to conventional practice having a value of about 0.1 to 0.5 megohm.

The electrical operation of the device is generally similar to the operation of conventional triode transistor devices except that improved results are obtained by the utilization of the high conductivity surface region 12. The emitter bias potential which biases the emitter barrier in its forward direction, i. e., the easy direction for current flow, simultaneously biases the barrier 14 between the surface region and the bulk of the wafer in the reverse direction. There is thus created an electric field perpendicular to the surface of the wafer and to the barrier 14 which field repels electrons from the surface. Electrons injected by the emitter electrode into the bulk of the wafer are driven away from the major recombination surface 8 and caused to diffuse toward the collector electrode. In previous devices a portion of the injected electrons diffuses toward the surface of the wafer adjacent to the emitter and recombines thereat with holes and becomes lost. The effective surface recombination velocity in devices according to the invention is substantially reduced and the current gain as represented by the proportion of injected minority charge carriers arriving at the collector electrode is substantially improved.

Figure 2 illustrates a filamentary transistor according to the invention which may be utilized as a delay type device. This transistor comprises a base filament 3 of n-type semiconductive germanium having a resistivity preferably in the range of about 10 to 25 ohm-cm. The size of the filament is not critical. It may be, for example, about 8.5 mm. long and about 1 mm. in diameter. Over most of its length it bears an enveloping surface region 9 of relatively low resistivity. This surface region, or sleeve is integrally united with the base or central portion 3 of the filament but electrically separated therefrom by an n+-n rectifying barrier 15.

The filament is also provided with two non-rectifying and two rectifying connections. The two non-rectifying connections 30 and 32 may consist of platinum or platinum alloy wires soldered to the filament by a 98% lead-2% antimony solder. They contact opposite ends of the filament, one of the connections 32 being preferably in the form of a ring surrounding the filament. The first rectifying connection 34 is utilized as an emitter and is chosen for its injection ability rather than its rectifying characteristics. It may be a pointed tungsten or molybdenum wire electrically welded to the filament by known techniques. The second rectifying connection 36 at the opposite end of the filament from the emitter is utilized as a collector and is chosen for its rectifying characteristics since, when the device is in operation, the collector is biased in the reverse direction. The collector may be a surface alloyed electrode of indium, for example. A non-rectifying connection 38 is made to the low resistivity sleeve 9.

The device may be incorporated in a circuit as shown in Figure 2 which includes a battery 40 of about 4.25 volts potential connected between the non-rectifying contacts at the two ends of the filament to provide an electric field along the length of the filament. Since the filament is about 8.5 mm. long, the field amounts to about 5 volts/cm. The low resistivity sleeve and the emitter electrode are biased positively with respect to the positive end of the filament by a battery 42 which may be of about 0.1 to 1 volt potential. Signal input means 44 are incorporated in the circuit between the battery 42 and the emitter electrode 34. An output circuit including a resistor 46 and a biasing battery 48 is connected between the collector electrode and the negative end of the filament.

In operation minority charge carriers, in this case holes, injected by the emitter are accelerated by the electric field along the length of the filament toward the collector where they are collected to produce a signal in the output circuit. The device is capable of amplification due to the difference in barrier impedances between the forwardly biased emitter and the reverse biased collector electrodes. The principal function of the device, however, is as a time delay device since the charge carriers injected by the emitter travel at a limited speed through the length of a filament as determined by the applied field. The actual delay time may be computed according to the formula:

$$T=\frac{x}{\mu E}\text{ seconds}$$

where $x$ is the length of the filament in cm. from the emitter to the collector;

$\mu$ is the mobility of the minority charge carriers in the semiconductive material in cm.²/volt-sec.; and E is the accelerating field in volts/cm.

Accordingly, the time delay may be computed for any given semiconductive material used as a base filament in the device and for any given size of filament. Thus, in the device shown in Figure 2 where $x=0.85$ cm., $\mu=1.7\times10^3$ cm.²/volt-sec. and $E=5$ volts/cm., the delay time $$T=\frac{0.85}{1.7\times10^3\times5}=10^{-4}\text{ sec.}=100\mu\text{ seconds}$$

The delay may be readily adjusted in a given device by varying the applied electric field.

One of the major difficulties previously encountered in attempting to build devices of such filamentary type is the relatively great loss of injected minority carriers by the surface recombination effect. In previous devices charge carriers constantly diffuse radially during their axial progression along the filament and recombine with majority carriers at the surface of the filament and become lost. According to the invention, however, an n+n rectifying barrier is provided adjacent to the surface of the filament along most of its length. Means are provided to bias this barrier in the reverse direction during operation of the device so that the minority charge carriers are repelled from the filament surface and constrained to the bulk region of the filament. In this way the surface recombination effect is minimized and the current gain of the device is improved. As heretofore stated, the bulk recombination effect is relatively unimportant and may be minimized by known techniques of purifying the semiconductive materials and forming them into substantially single crystal bodies.

The instant invention overcomes one of the major difficulties encountered in making previous delay devices of the filamentary type. It is desirable in such devices to minimize the transverse cross-sectional area of the filament, i. e., to reduce its diameter as far as possible in order to minimize the heat generated by the current flow induced by the accelerating potential. This is a problem relating to the so-called ohmic current which is carried primarily by the majority charge carriers in the filament. (The signal current is carried by minority charge carriers and is insignificant with respect to heat dissipation requirements.) In previous devices if the filaments are made small enough to reduce the heat dissipation requirements to practical values, the outer surfaces of the filaments are brought so close together that the surface recombination effect reduces the signal to impractically small proportions. In devices according to the invention, on the other hand, the filaments may be made as small as physically possible without increasing the surface recombination effect because the signal charge carriers are repelled from the surface by an electric field.

The low resistivity surface regions of devices according to the invention may be formed by any known method. Two well known methods are diffusion and surface alloying. For example, to produce the p+ region 12 in the wafer shown in Figure 1, a selected conductivity type-determining material such as indium, gallium or aluminum may be evaporated upon the wafer surface before any of the electrodes or base contacts are bonded thereto. The wafer bearing the evaporated film may then be heated in a non-oxiding atmosphere at about 700° to 800° C. for five minutes to one hour to cause the film material to diffuse into the wafer to provide an added impuriity concentration in the region adjacent to the surface. The temperatures and the times of heating for the diffusion are not critical since the thickness of the low resistivity region is not critical. The only practical limiting factor to the thickness of the region is the requirement that the transistor electrode (in the case shown in Figure 1 the emitter electrode 4) penetrate completely through the region to contact the relatively high resistivity bulk portion of the wafer. Alternatively, the electrode may be alloyed to the surface before the impurity is evaporated and diffused into the wafer to form the surface region.

The surface region or sleeve shown on the filament of Figure 2 may also be formed by diffusion in exactly the same manner as the surface region of the wafer of Figure 1. Alternatively it may be formed by a surface alloying process in which a foil composed of about 90% lead and 10% antimony is wrapped around the filament and then heated at about 650° C. for about five minutes in a non-oxidizing atmosphere to cause the lead-antimony foil to alloy with the surface of the filament to form the rectifying barrier 15 within the filament.

If the sleeve of low resistivity material is formed by the alloy process it actually consists then of two parts. One part, adjacent to the barrier, is germanium bearing a significantly high concentration of conductivity type-determining impurities and the outer portion is metallic being the alloy of lead and antimony which now includes a small proportion of dissolved germanium. Again, it should be noted that the thickness of the low resistivity region is not critical in devices of the invention, since the minority charge carriers in the bulk of the semiconductive body are repelled by an electric field as they approach the surface region.

If a surface alloy process is utilized to form the surface region of the triode transistor device shown in Figure 1, the metallic portion of the surface layer formed by the process is preferably removed before an electrode is alloyed through the region. This may be done by etching in a solution which preferentially attacks the metallic material and does not react strongly with the semiconductive material. In the case of indium, for example, the metallic layer may be readily removed without affecting the germanium by immersing the entire unit in mercury and subsequently rinsing it in nitric acid.

The invention is, of course, not limited to the specific devices illustrated herein nor to devices made of the specific materials herein described. The invention is generally applicable to all semiconductive devices and particularly to those that are subject to surface recombination effects. Many different arrangements of such devices are known. For example, similar devices may be made by cutting a relatively large barrier-containing single crystal of semiconductive material into small pieces, each one of which contains one, two or more rectifying barriers. Devices may also be made comprising a large plurality of electrodes upon a single wafer of semiconductive material. Other materials also may be used as the semiconductive bases of devices according to the invention, for example, silicon or intermetallic compounds such as compounds of aluminum, gallium and indium with phosphorus, arsenic and antimony.

It should also be noted that the principles of the invention are not limited to devices incorporating the conductivity type arrangements specifically shown herein. Triode transistor devices, for example, may be made according to the invention utilizing an n-type semiconductive base and an n+ surface region as well as the p-type base and p+ surface region shown in Figure 1. The invention, broadly, comprises the use of an n+—n or a p+—p barrier biased in the reverse direction to repel minority charge carriers away from the barriers and into the n or p conductivity material adjacent thereto. The instant invention comprises a principle whereby minority charge carriers are repelled from surfaces where in previous devices they had recombined with majority carriers and become lost.

Semiconductive materials other than germanium may also be utilized in devices according to the principles of the invention. In general any crystalline semiconductive material that conducts electric current by electronic transport as distinguished from ionic transport may be used to make devices according to the invention. Examples of known, practical materials are silicon, germanium-silicon alloys, and compounds of aluminum, gallium or indium with phosphorus, arsenic or antimony.

There have thus been described improved semiconductor devices having improved current gain characteristics.

What is claimed is:

1. A semiconductor device comprising a body of semiconductive material of one conductivity type including a surface region of said one conductivity type having a greater conductivity than the bulk of said body, said region being electrically separated from said bulk by a rectifying barrier, a rectifying electrode penetrating through said surface region and in contact with said bulk, a second rectifying electrode in contact with said bulk, and non-rectifying electrodes in contact with said bulk and said surface region respectively.

2. A semiconductor device comprising a body of semiconductive material of one conductivity type including a surface region of said one conductivity type having a greater conductivity than the bulk of said body and being separated from said bulk by a rectifying barrier, a first rectifying electrode penetrating through said surface region and in contact with said bulk, a second rectifying electrode in contact with said bulk, a first non-rectifying electrode in contact with said bulk, a second non-rectifying electrode in contact with said surface region, a direct electrical connection between said first rectifying electrode and said second non-rectifying electrode, an input signal source and a direct current voltage source connected in series between said first and said second non-rectifying electrodes, and a direct current voltage source connected in series with an output impedance circuit between said first non-rectifying electrode and said second rectifying electrode.

3. A semiconductor device comprising a body of p-type semiconductive germanium including a surface region of greater conductivity than the bulk of said body, said surface region being electrically separated from said bulk by a p+p rectifying barrier, a rectifying electrode penetrating through said surface region and in contact with said bulk, said rectifying electrode being electrically separated both from said bulk and from said surface region by p–n rectifying barriers, a second rectifying electrode in contact with said bulk, and non-rectifying electrodes in contact with said bulk and said surface region respectively.

4. A semiconductor device comprising a body of n-type semiconductive germanium including a surface region having a greater conductivity than the bulk of said body, said surface region being electrically separated from said bulk by a n+n rectifying barrier, a rectifying electrode penetrating through said surface region and in contact with said bulk, said rectifying electrode being electrically separated both from said bulk and from said surface region by p–n rectifying barriers, a second rectifying electrode in contact with said bulk, and non-rectifying electrodes in contact with said bulk and said surface region respectively.

5. A semiconductor device comprising a wafer of semiconductive germanium of one conductivity type including a surface region having a greater conductivity than the bulk of said wafer, said surface region being electrically separated from said bulk by a rectifying barrier, a first rectifying electrode penetrating through said surface region in contact with said bulk, a second rectifying electrode in contact with said bulk upon an opposite face of said wafer from said first rectifying electrode and coaxially aligned with said first rectifying electrode, a first non-rectifying electrode in contact with said bulk and a second non-rectifying electrode in contact with said surface region.

6. A semiconductor device comprising a filament of semi-conductive material of one conductivity type including a longitudinal circumferentially enveloping surface region of said one conductivity type and having a greater conductivity than the bulk of said filament, a first rectifying connection and a first non-rectifying connection at one end of said filament, a second rectifying connection and a second non-rectifying connection at the opposite end of said filament, and a non-rectifying connection to said surface region.

7. A semiconductor device comprising a body of semiconductive material of one conductivity type including a surface region of said one conductivity type having a greater conductivity than the bulk of said body, means extending through said surface region and in contact with said bulk to inject minority charge carriers into said bulk in a region adjacent at least a portion of said surface region, means to collect minority charge carriers from said bulk, and means spaced from said injecting means to maintain said surface region at a predetermined potential with respect to said bulk.

References Cited in the file of this patent

UNITED STATES PATENTS

| | | |
|---|---|---|
| 2,561,411 | Pfann | July 24, 1951 |
| 2,597,028 | Pfann | May 20, 1952 |
| 2,603,693 | Kircher | July 15, 1952 |
| 2,603,694 | Kircher | July 15, 1952 |

FOREIGN PATENTS

| | | |
|---|---|---|
| 1,098,372 | France | Mar. 2, 1955 |